US010991428B2

(12) United States Patent
Arsovski et al.

(10) Patent No.: US 10,991,428 B2
(45) Date of Patent: *Apr. 27, 2021

(54) TERNARY CONTENT ADDRESSABLE MEMORY

(71) Applicant: INTERNATIONAL BUSINESS MACHINES CORPORATION, Armonk, NY (US)

(72) Inventors: Igor Arsovski, Williston, VT (US); Suparna Bhattacharya, Bangalore (IN); Arvind Kumar, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/743,695

(22) Filed: Jan. 15, 2020

(65) Prior Publication Data

US 2020/0152270 A1 May 14, 2020

Related U.S. Application Data

(63) Continuation of application No. 16/243,574, filed on Jan. 9, 2019, now Pat. No. 10,566,058, which is a continuation of application No. 14/818,764, filed on Aug. 5, 2015, now Pat. No. 10,204,685.

(51) Int. Cl.
*G06F 12/00* (2006.01)
*G11C 15/04* (2006.01)
*G06F 12/14* (2006.01)

(52) U.S. Cl.
CPC .............. *G11C 15/04* (2013.01); *G06F 12/14* (2013.01)

(58) Field of Classification Search
None
See application file for complete search history.

(56) References Cited

U.S. PATENT DOCUMENTS

| | | | |
|---|---|---|---|
| 7,024,516 | B2 | 4/2006 | Lu |
| 7,050,317 | B1 | 5/2006 | Lien et al. |
| 7,565,482 | B1 | 7/2009 | Rangarajan et al. |
| 7,634,500 | B1 | 12/2009 | Raj |
| 8,214,305 | B1 | 7/2012 | Birman et al. |
| 10,204,685 | B2 | 2/2019 | Arsovski et al. |
| 2006/0155915 | A1 | 7/2006 | Pereira |
| 2009/0077663 | A1 | 3/2009 | Sun et al. |

(Continued)

FOREIGN PATENT DOCUMENTS

WO 2015063725 5/2015

OTHER PUBLICATIONS

Shinde et al., "Similarity Search and Locality Sensitive Hashing using Ternary Content Addressable Memories", SIGMOD'10, Indianapolis, Indiana, USA, Jun. 6-11, 2010, 13 pages.

(Continued)

*Primary Examiner* — Jason W Blust
(74) *Attorney, Agent, or Firm* — Steven Meyers; Andrew M. Calderon; Roberts Calderon Safran & Cole, P.C.

(57) ABSTRACT

Ternary content addressable memory (TCAM) structures and methods of use are disclosed. The memory architecture includes one or more ternary content addressable memory (TCAM) fields, and control logic that applies progressively discriminating data-masking and scores a closeness of a match based on matched and mismatched bits.

17 Claims, 7 Drawing Sheets

(56) References Cited

U.S. PATENT DOCUMENTS

2017/0040059 A1    2/2017    Arsovski et al.
2019/0147952 A1    5/2019    Arsovski et al.

OTHER PUBLICATIONS

Meiners et al., "TCAM Razor: A systematic approach towards minimizing packet classifiers in TCAMs", Network Protocols, IEEE International Conference on IEEE, 2007, 10 pages.

Bhattacharya et al., "Virtually cool ternary content addressable memory", Proceedings of the 13th USENIX conference on hot topics in OS. 2011, 5 pages.

Zheng et al., "A TCAM-based distributed parallel IP lookup scheme and performance analysis", Networking, IEEE/ACM Transactions on 14.4, 2006, pp. 863-875.

Arsovski et al., "A ternary content-addressable memory (TCAM) based on 4T static storage and including a currentrace sensing scheme". IEEE Journal of Solid-State Circuits 38.1, 2003, pp. 155-158.

Harchol et al., "Nearest Neighbor Search in 0(1) Using TCAM", Hebrew University and IDC Herzliya, Mar. 30, 2014, 1 page.

Search Report and Written Opinion in the related GB Application No. PCT/IB2016/054609, dated Oct. 26, 2016, 8 pages.

List of IBM Patents or Patent Applications Treated as Related, dated Jan. 8, 2020, 1 page.

TERNARY CONTENT ADDRESSABLE MEMORY

FIELD OF THE INVENTION

The invention relates to semiconductor structures and, more particularly, to ternary content addressable memory (TCAM) structures and methods of use.

BACKGROUND

A fundamental problem in identity resolution is the rapid determination of whether a new, incoming record has a match with any other record in a database. The main purpose is not to find an exact match, but rather to find rapidly approximate matches which allow for variations. Variations may arise because data comes from multiple sources, in which case the problem is to identify records belonging to the same entity. Variations can be intentional (e.g., fraudulently using a different name) or unintentional (e.g., using "Bob" instead of "Robert", or interchanging two digits in a phone or social security number).

SUMMARY

In an aspect of the invention, a memory architecture comprises one or more ternary content addressable memory (TCAM) fields, and control logic that applies progressively discriminating data-masking and scores a closeness of a match based on matched and mismatched bits.

In an aspect of the invention, a method comprises: searching a record field; and incrementing a match counter for each match entry by a weighted value.

In an aspect of the invention, an encoding scheme of detecting existence of a wildcard, comprises: entering 1, 1 on Slx and Sly search lines; and detecting a match in a record field which is indicative of a wildcard.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1A:
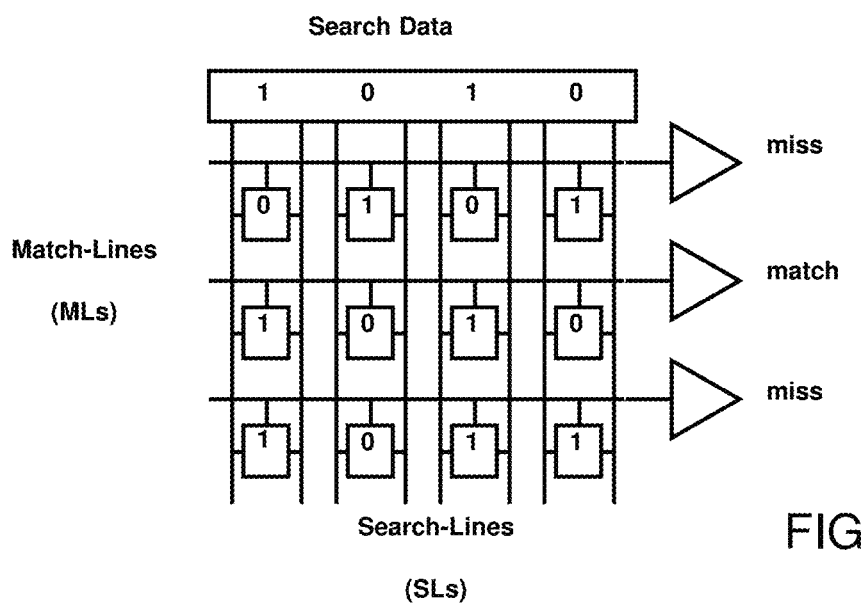
FIGS. 1a and 1b show a general architecture of a ternary content addressable memory (TCAM).

The invention relates to semiconductor structures and, more particularly, to ternary content addressable memory (TCAM) structures and methods of use. In more specific embodiments, the present invention provides a hardware acceleration which rapidly identifies and ranks approximate matches, particularly when dealing with very large databases. Advantageously, the memory architectures described herein provide faster and more accurate search results.

In embodiments, the memory architectures are provided with a control data-path for fast approximate match record detection. In embodiments, the memory architecture comprises one or more TCAM fields, and control logic that controls the application of local and global masking. The control logic applies progressively more discriminating data-masking and scores the closeness of a match based on the matched/mismatched bits. In embodiments, the control logic can use TCAM with a novel way of global masking to distinguish between an empty record which fully matches and matching records by scoring them differently.

In further embodiments, using the memory architectures described herein, fast field-based searches can be used to identify potential matches which can, in further embodiments, be scrutinized with within-field bit-matching. In embodiments, the memory architectures described herein can use within-field bit-matching, alone. Records that score high on a match index can be combined by pointers to be associated as a single group of records simplifying the data-base.

In accordance with aspects of the invention, the search processes include identity matching which are accelerated using the TCAM architecture in accordance with aspects of the invention. For example, in TCAM processes, both deterministic rules and probabilistic approaches can be implemented. For example, the deterministic rules provide for approximate matching in well-known field types such as addresses, names, phone numbers, etc. Also, the deterministic rules can use similarity measures for strings, images, documents, etc. On the other hand, probabilistic approaches are used to deduce which fields/values are more discriminating. In approaches, the processes count hits for a value to assign higher weights to values which are less common, and match incoming records to previous entities and pick high score candidates.

Candidates can be evaluated closely using deterministic rules to resolve the new record and perform context accumulation/correction. For example, if there is no resolution, the TCAM will add a new entity corresponding to an incoming record; whereas, if it is resolved to an entity but has disqualifying mismatch with some records for that entity, the TCAM will trigger an un-resolve. If it is resolved to multiple entities, the TCAM will re-resolve them into a single entity, but the processes will preserve the constituent entry information to enable un-resolve at a later time. The TCAM can also include a merge rule, where an incoming record is added to its resolved set and attributes are accumulated.

Figure 1B:
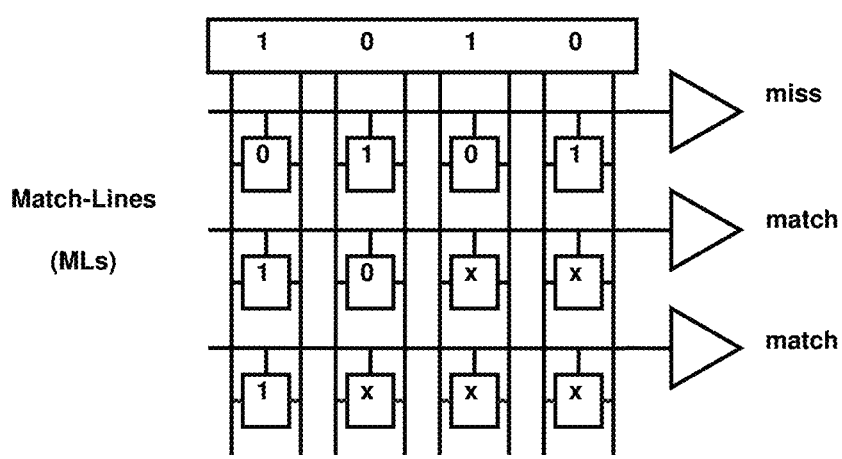

FIGS. 1a and 1b show a general architecture of a TCAM. TCAMs search entire memory content within a single clock cycle providing the fastest known way to implement a look-up table. Search data is applied to search lines (SLs) in parallel and search results develop on match lines (MLs) in parallel. As shown in FIGS. 1a and 1b, for example, a general TCAM architecture includes a plurality of match lines (ML) and search lines (SL), with search data. In FIGS. 1a and 1b, for example, the search data includes bits "1", "0", "1" and "0". In FIG. 1b, in addition to the bits "0" and "1", the TCAM can also store wild-cards "X", which are used in routing tables to allow longest prefix matching for network addresses, as an example. In a typical search operation, SLs are reset to GND and MLs are precharged to Vdd. Search data is applied to the SLs, and mismatches are detected on the MLs. Other methods of searching a TCAM exist.

Figure 2:
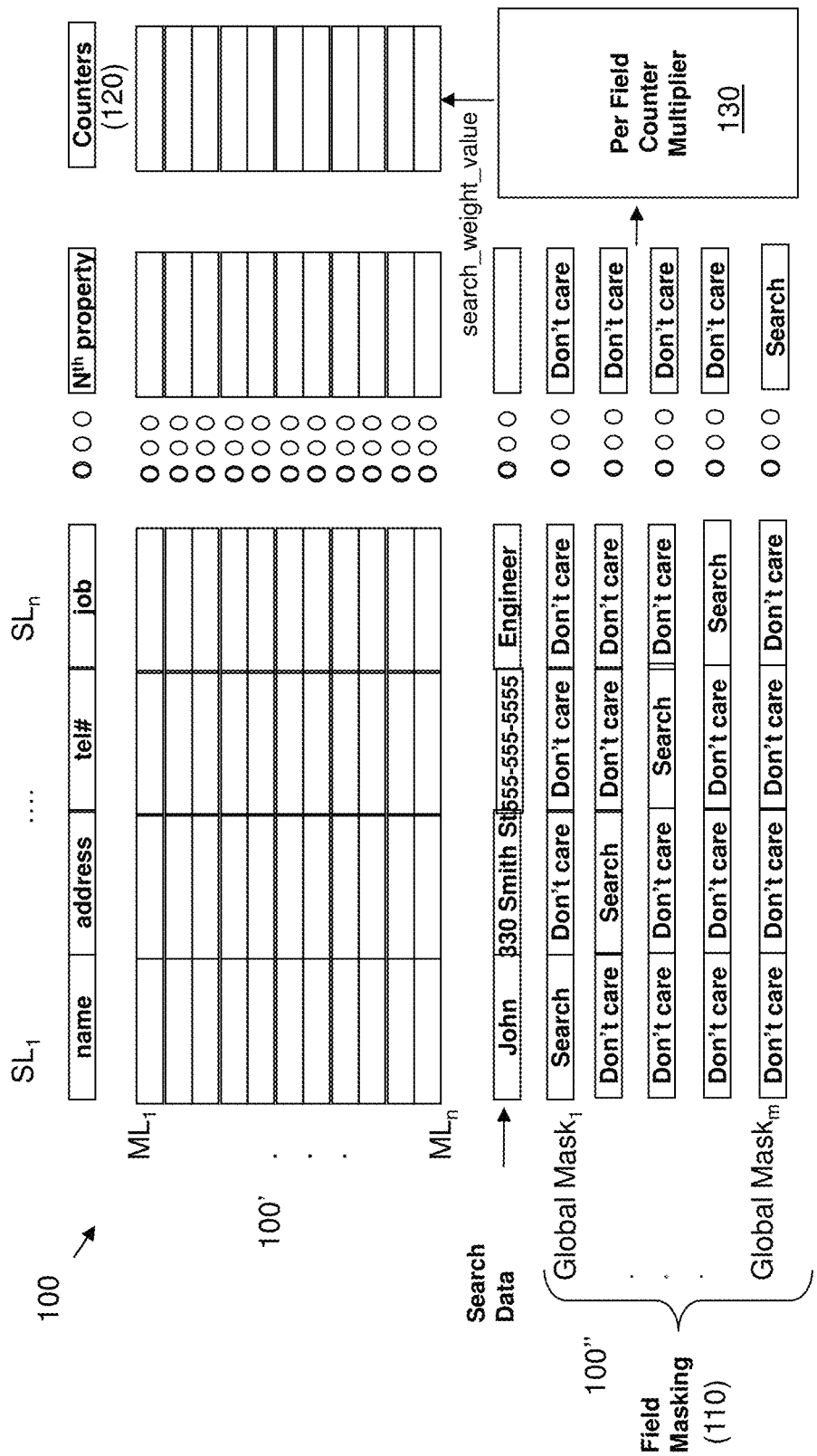
FIG. 2 shows a TCAM architecture and operational processes in accordance with aspects of the present invention.

FIG. 2 shows a TCAM architecture and operational processes in accordance with aspects of the present invention. In embodiments, the TCAM architecture 100 comprises one or more TCAM fields. For example, the TCAM architecture 100 comprises TCAM fields intersecting at, e.g., a plurality of search lines $SL_1 \ldots S_n$ and a plurality of match lines $ML_1 \ldots ML_n$. In the representative figures, the match lines $ML_1 \ldots ML_n$ of representation 100' contain stored data with the search lines $SL_1 \ldots SL_n$ having a generic field definition (e.g., name, address, tel # and job), whereas, representation 100" includes search lines $SL_1 \ldots SL_n$ that are searching exemplary search data, e.g., John, 330 Smith Street, 555-555-5555, Engineer, and plurality of global search masks, Global $Mask_1 \ldots$ Global $Mask_n$ that would be applied on the exemplary search data. More specifically, the representation 100" shows the process of executing an identity matching search operation, searching for the record that is shown as search data starting with "John" by applying a number of global search masks that allows the processes to score the match of each field shows as at reference numeral 110. In embodiments, the search data is pre-processed by one Global Mask at a time and then applied to the TCAM (via the SLs) to be compared with the data stored on each ML (these are the records—one/MLs).

The TCAM architecture further includes field masking, as shown representatively at reference numeral 110. More specifically, the TCAM architecture includes control logic that controls application of local and global masking as shown representatively at reference numeral 110. The TCAM global masks all columns of data where "don't cares" are applied allowing the TCAM to ignore mismatches in those fields while it focuses on interrogating all the TCAM entries in one-only field. Without this option a single mismatch in any field will cause a search on a record to always return a mismatch. With this operation it is now possible to distinguish between records that are mismatched in every field, and ones that are mismatch in perhaps only one field.

More specifically, as should be understood by those of skill in the art, the field masking 110 will mask off bits such that a lookup key will match a TCAM entry even if all bits in the key do not match the entry. This type of masking is called global masking since it applies to all TCAM entries, masking all bits where the search key sees a don't care in the Global Mask. Another form of masking is called local masking, where "don't cares" are stored into the TCAM. In other words, by masking out certain bits in the TCAM as "don't care" bits, more than one lookup key can match the same TCAM entry. Commonly, the mask function of the TCAM is used to remove (mask off) non-prefix bits in the TCAM so that multiple binary entries can be mapped into fewer compressed TCAM entries with "don't care" entries.

In embodiments, the control logic of the TCAM architecture 100 applies progressively discriminating global data-masking and scores the closeness of a match based on matched/mismatched bits. More specifically, the TCAM architecture 100 includes a counter 120 for each match line $ML_1 \ldots ML_n$ and a field counter multiplier 130 which provides a score for each match line $ML_1 \ldots ML_n$ based on a weighting (e.g., percentage) applied to each of the search lines $SL_1 \ldots SL_n$ or groups of them. For example, in embodiments, the field counter multiplier 130 calculates a weighting for each match line $ML_1 \ldots ML_n$ and provides that weighting as a score to the counter 120. In embodiments, it is contemplated by the processes described herein that a set weight can be provided for a group of SLs (e.g., a field like name, tel #, etc) or in the finest granularity a single SL.

By way of illustrative example, each of the search lines $SL_1 \ldots SL_n$ can be individually weighted, e.g., a percentage value can be assigned for each search line $SL_1 \ldots SL_n$. In embodiments, the SLs can represent groups of SLs. The weighting can be different for each search line $SL_1 \ldots SL_n$, with a higher percentage weight allocated to a search line with records that would have a higher confidence for a match. For example, a field associated with social security number may be given a high percentage (high weight) compared to a field of a first name of a person. (In searching, it is more likely that a match would exist based on a correct social security number, compared to a first name of an individual.) In operation, multiple searches are executed on all stored words, with one field/search cycle. The match on each separate search would increment its corresponding counter 120 by the value of that field, e.g., weight as calculated by the field counter multiplier 130. At the completion of the search the counters would then be examined to sort from highest to lowest probability of a match.

By way of further illustrative example, the following calculations can be made as shown in Table 1 below to provide a probability of a match in accordance with aspects of the invention. By using the below or similar calculations, the TCAM of the present invention can provide a score and a match, as calculated for each for cycle.

TABLE 1

| | $SL_1$ 10% | $SL_2$ 25% | $SL_3$ 50% | $SL_n$ 15% | Counter |
|---|---|---|---|---|---|
| $ML_1$ | Close Match | Match | Match | No Match | 125 |
| $ML_2$ | Match | Close Match | No Match | Close Match | 37.5 |
| $ML_3$ | No Match | No Match | Close Match | Match | 7.5 |
| $ML_N$ | No Match | Match | No Match | Close Match | 3.75 |

In this illustrative example, each percentage for a match and close match is multiplied together for purposes of the score. These scores can then be divided by 100 in order to obtain a more manageable score. By way of example for match line $ML_2$ (10%×25%×15%)/100=37.5. It should be understood by those of skill in the art that other methods of calculating the score with the field counter multiplier 130 and then providing such to the counter 120 are also contemplated by the present invention. For example, the present invention also contemplates multiplying the score of each field by match(1) or mismatch(0) and then adding it to all the other fields (e.g., ML1 would have had 10+25+50=85%, while MLN would have 25+15=40%). In any scoring scenario, though, based on the above results the greatest likelihood of a match in this example would be match line $ML_1$.

In embodiments, the per-field counter multiplier can be dynamically determined using hit count. For example, the counter can automatically assign a higher weight to less common (and hence more discriminating) values. More specifically, in embodiments, the weight/match field could be determined by the query dynamically, e.g., more hits=lower weight and less hits=higher weight. Also, as another example, during a search, the result of applying a static counter multiplier for a field is further adjusted by ratio of the number of entries in the TCAM and the match hit count for the field. In still further embodiments, the counter can automatically assign a weight based on approximate population count logic (e.g., on match-lines).

Figure 3:
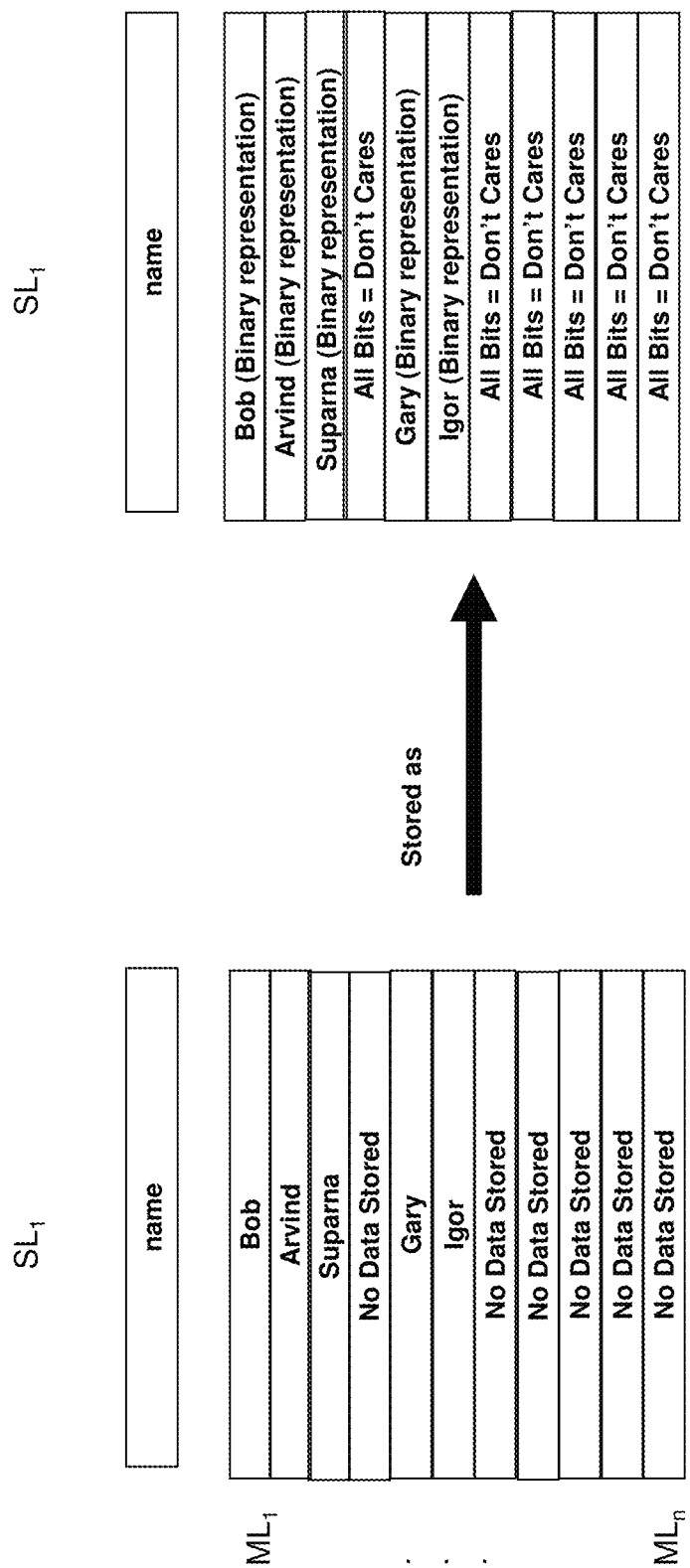
FIG. 3 shows additional operational processes of the TCAM architecture in accordance with aspects of the present invention.

FIG. 3 shows additional operational processes in accordance with aspects of the present invention. In this implementation, the TCAM architecture 100 is represented by a single search line $SL_n$ and multiple match lines $ML_1$ . . . $ML_n$. In embodiments, a single field can be multiple bits wide and therefore will have two SLs for each bit of the field width. As stored, each record in the match lines $ML_1$ . . . $ML_n$ are stored as binary representations, e.g., each letter or number is represented as a bit or combination of bits. All records with no data stored are stored as "don't care". In this implementation, the processes described herein will provide a bit-by-bit comparison, and similar to that described with respect to FIG. 2, each bit or combination of bits representative of a letter or number will be associated with a weighting.

In the above noted implementation, a progressive intra-field-based approximate-matching (with no data stored detection) is provided. In this implementation, the search will start with miss anything but "all bits=don't care" on that field. Here, the TCAM will set search lines (SL) for all bits in the field to "1", in which only all "don't care" entries will match. The fields will be marked that match, with no incrementing of their counter. Next, the search will continue for the exact data to how many hits are obtained, adjusting the counter appropriately. In embodiments, two cycles per field will provide both whether the field is empty and whether it matches the search data.

Figure 4:
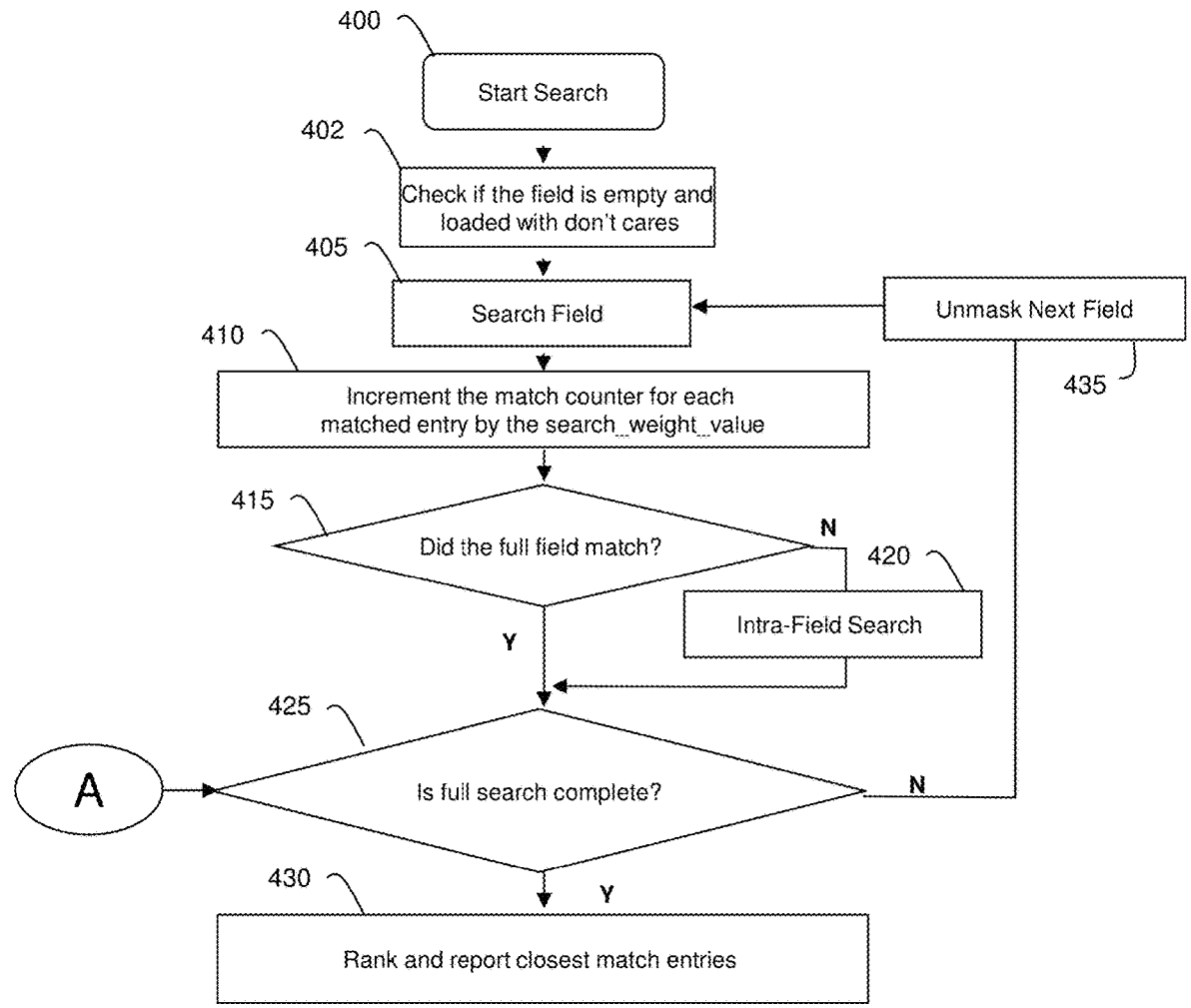
FIG. 4 shows a flow implementing processes of the TCAM architecture in accordance with aspects of the invention.
Figure 5:
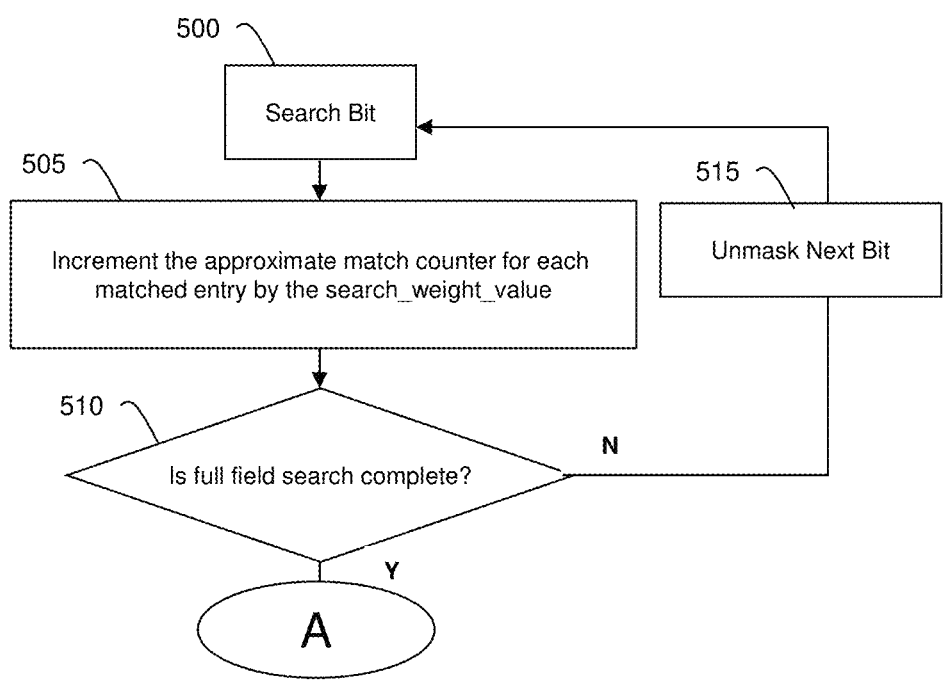
FIG. 5 shows a flow implementing additional processes of the TCAM architecture in accordance with aspects of the invention.

FIG. 4 shows a flow implementing processes in accordance with aspects of the invention. More particularly, FIG. 4 shows steps implementing the processes as described with respect to FIG. 2. At step 400, the processes start. At step 402, the processes of the invention check if the field is empty and loaded with "don't cares". In this process, the TCAM will set search lines (SL) for all bits in the field to "1", in which only all "don't care" entries will match. At step 405, a search begins for a field. At step 410, the match counter is incremented for each match entry by the weighted value. At step 415, a determination is made as to whether the full field matches. If not, at step 420, an optional intra-field match process can continue as shown in FIG. 5. If a full field did match, or the optional matching process is not performed, the process continues to step 425. At step 425, a determination is made as to whether a full search is complete. If not, then the process continues to step 435, where the next field is unmasked. The process will then continue with step 405. Otherwise, if a full search is complete, the closest matches are ranked (e.g., highest to lowest score) and a report is provided.

FIG. 5 shows a flow implementing intra-field matching processes in accordance with aspects of the invention. More particularly, FIG. 4 shows steps implementing the processes as described with respect to FIG. 3. At step 500, the processes search a bit. At step 505, the processes increment the approximate match counter for each matched entry by the search weighted value, e.g., the score. At step 510, a determination is made as to whether a full search is complete. If not, then the process continues to step 515, where the next bit is unmasked. The process will then continue with step 500. Otherwise, if a full search is complete, the search continues to step 425 of FIG. 4.

Figure 6:
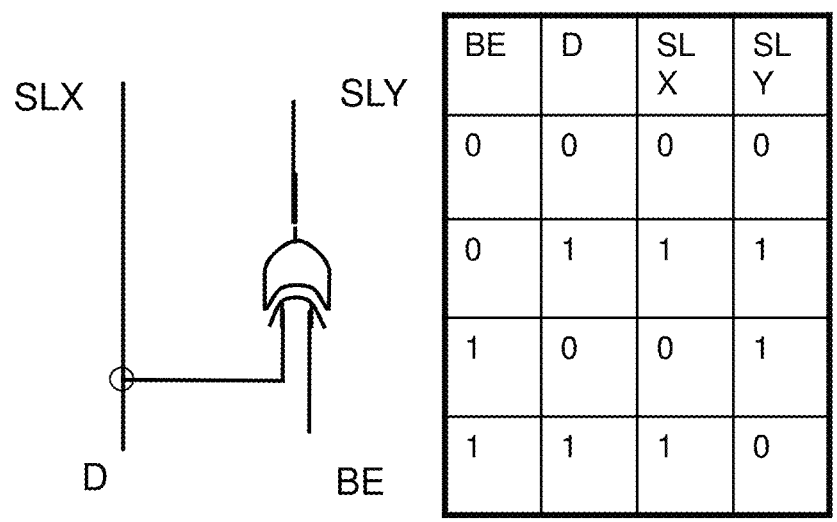
FIG. 6 shows an encoding scheme of a TCAM architecture in accordance with aspects of the invention.

FIG. 6 shows an encoding scheme of a TCAM in accordance with additional aspects of the invention. In particular, the encoding scheme of the TCAM shown in FIG. 6 can be used to detect the existence of wildcards and, with such detection, the weighting can be adjusted appropriately. For example, a wildcard would have a 0% weighting. By way of more specific example, binary data is always stored as (0, 1) or (1, 0). However, a wildcard entry is stored as an "X" (0, 0). By entering 1, 1 on Slx and Sly, any match across the field will be indicative that the searched bits contain wildcards "X". Once a wildcard is detected, the entry can be weighted accordingly.

In further embodiments, by default "don't care" bits do not represent a missing value correctly. In traditional encoding, these "don't care" bits would be treated as a match instead of an unknown. To solve this problem, though, the encoding of the present invention can handle missing fields by marking a "don't know" bit in the field and splitting counters, with two separate counters per entry to accumulate field-wise matches vs. mismatches. Accordingly, if the "don't know" bit is set, the value of the field does not contribute to either of the counters. Otherwise, if a field value matches, the query field updates the match counter or else updates the mismatch counter. So, by example, if a search was performed for "red car", a red car stored would fetch 10 in the match counter, a green car would fetch −10 in the mismatch counter and no data stored would fetch 0.

Figure 7:
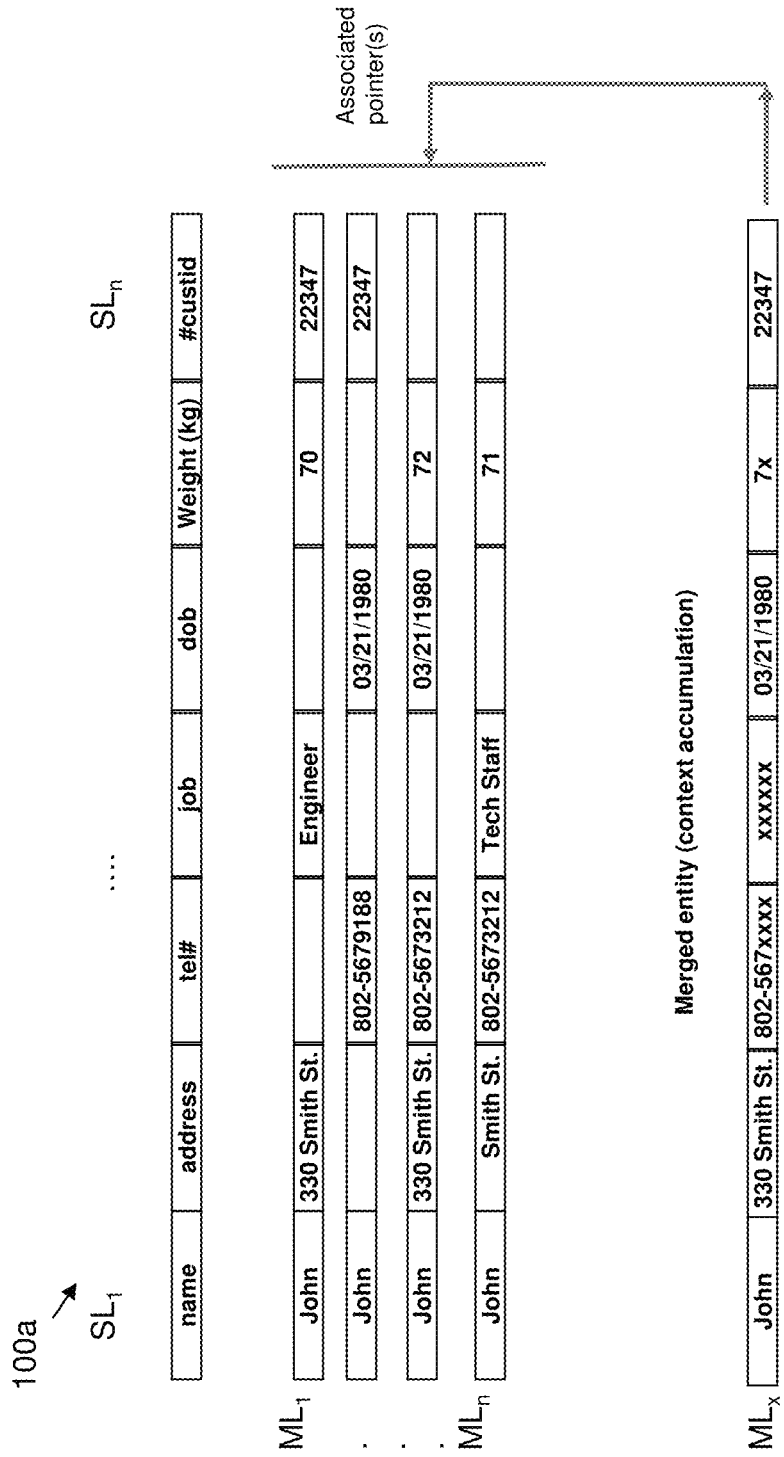
FIG. 7 shows a TCAM architecture and operational processes in accordance with additional aspects of the present invention.

FIG. 7 shows a TCAM architecture and operational processes in accordance with additional aspects of the present invention. In more particular embodiments, the TCAM architecture and processes, as designated by reference numeral 100a. The TCAM architecture 100a includes a plurality of search lines $SL_1$ . . . $SL_n$ and plurality of match lines $ML_1$ . . . $ML_n$. The TCAM architecture 100a further includes a merged match line $ML_x$. In embodiments, the merged match line $ML_x$ shows merged match lines $ML_1$ . . . $ML_n$ using wild-cards to accumulate context. In other words, any context that does not match within the match lines $ML_1$ . . . $ML_n$ for each respective search lines $SL_1$ . . . $SL_n$ will be represented as a wildcard ("x").

In embodiments, the processes of the invention will accumulate context for an entity while preserving constituent observation records. For example, the processes described herein will add a new observation record to an entity by merging its field values with accumulated context to create an over-approximated page entry. The processes described herein will associate the page entry with all the constituent observation records using associated pointers. The associative pointer can also be associated pointers to associated pointers if you run out of space. The pointer(s) can be updated as new data arrives.

If two entities which were thought to be separate need to be re-resolved, then their page entries become nested constituents. The indirect scoping can be used to match associate records for an entity if the page entry matches (per threshold logic to identify candidates). In embodiments, the processes described herein identify if there are any disqualifying mismatches (e.g. date of birth) to un-resolve. If none of the individual observations are above the match threshold, even though the accumulated page entry matches, the processes described herein will exit to slow path, and if record still resolves to this entity, the processes described herein will add a mark of "needs validation on un-resolve". In embodiments, the processes can occur recursively if nested resolutions are involved. In this way, the number of search cycles needed is greater or equal to the search depth.

If an un-resolve is needed, e.g., if incoming record matches accumulated context entry but has a disqualifying mismatch with an observation, the processes described herein may complete details of un-resolve logic (e.g., speed up using TCAM to find the observations that need to be re-analyzed for unresolve). The processes described herein can also link previously assumed similar records, search for identity as it comes in and compare it to: (i) the records that hit or (ii) the associated data along with the records that hit. In further embodiments implementing this aspect of the invention, the processes described herein can reorganize related records using wild cards, as well as provide data encoding of a field from highest to lowest order of magnitude, as already described herein.

The structure(s) as described above is used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory architecture comprising:
    one or more ternary content addressable memory (TCAM) fields;
    a plurality of match lines ML1 . . . MLn; and
    control logic that scores a closeness of a match between bits as a weighted percentage as applied to each TCAM field,
    wherein the control logic merges records on individual match lines of the plurality of match lines ML1 . . . MLn using wildcards to accumulate context with associated pointers from the merged match lines to an original record.

2. The memory architecture of claim 1, further comprising a counter for each match line of the plurality of match lines ML1 . . . MLn and a counter multiplier which provides a weighted score to the counter.

3. The memory architecture of claim 2, wherein the weighted score is assigned a higher percentage weight allocated based on a confidence for the match.

4. The memory architecture of claim 2, wherein the counters are examined to sort from highest to lowest probability of the match.

5. The memory architecture of claim 2, wherein the counter multiplier dynamically determines the weighted score using hit count.

6. The memory architecture of claim 5, wherein the counter multiplier automatically assigns a weight that is inversely related to the hit count.

7. The memory architecture of claim 6, wherein more hits equal lower weight and less hits equal higher weight.

8. The memory architecture of claim 1, further comprising, after identifying potential matches, performing within-field bit-matching.

9. The memory architecture of claim 8, wherein the within-field bit-matching includes a bit by bit search within each field.

10. The memory architecture of claim 1, wherein records are combined by pointers to be associated as a single group of records.

11. The memory architecture of claim 1, wherein the control logic uses global masking to distinguish between an empty record which fully matches and matching records by scoring them differently.

12. The memory architecture of claim 1, further comprising preserving constituent observation records.

13. A method, comprising:
    searching a record field; and
    incrementing a match counter for each match entry by a weighted value,
    wherein records are merged on individual match lines of a plurality of match lines ML1 . . . MLn using wildcards to accumulate context with associated pointers from the merged match lines to an original record.

14. The method of claim 13, wherein when a full field does not match, unmasking a next field and performing the searching.

15. The method of claim 13, wherein when a full field does not match, performing an intra-field match process.

16. The method of claim 15, wherein the intra-field match process comprises searching a field bit by bit and incrementing a match counter for each matched entry by the search weighted value.

17. The method of claim 16, wherein the weighted value is inversely related to a hit count.

* * * * *